US011276737B2

(12) United States Patent
Ko et al.

(10) Patent No.: US 11,276,737 B2
(45) Date of Patent: Mar. 15, 2022

(54) PATTERN PART, METHOD FOR FORMING PATTERN PART AND METHOD FOR MANUFACTURING DISPLAY DEVICE USING SAME

(71) Applicant: SAMSUNG DISPLAY CO., LTD., Yongin-si (KR)

(72) Inventors: Seungcheol Ko, Yongin-si (KR); Junho Sim, Yongin-si (KR); Seyoon Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 118 days.

(21) Appl. No.: 16/662,712

(22) Filed: Oct. 24, 2019

(65) Prior Publication Data
US 2020/0152718 A1    May 14, 2020

(30) Foreign Application Priority Data

Nov. 14, 2018    (KR) .......................... 10-2018-0139977

(51) Int. Cl.
H01L 27/32    (2006.01)
H01L 51/00    (2006.01)
H01L 51/52    (2006.01)
H01L 51/50    (2006.01)
H01L 51/56    (2006.01)

(52) U.S. Cl.
CPC ...... H01L 27/3246 (2013.01); H01L 51/0016 (2013.01); H01L 51/0018 (2013.01); H01L 51/5056 (2013.01); H01L 51/5206 (2013.01); H01L 51/5253 (2013.01); H01L 51/56 (2013.01); H01L 2251/301 (2013.01)

(58) Field of Classification Search
CPC ... H01L 51/00; H01L 51/001; H01L 51/0016; H01L 51/0018; H01L 51/50; H01L 51/505; H01L 51/5056; H01L 51/52; H01L 51/52; H01L 51/5206; H01L 51/525; H01L 51/5253; H01L 51/56; H01L 27/32; H01L 27/324; H01L 27/3246; H01L 2251/301
USPC ...................................................... 438/669
See application file for complete search history.

(56) References Cited

U.S. PATENT DOCUMENTS

2009/0286357 A1* 11/2009 Beer .................... H01L 23/544
                                                         438/113
2015/0125671 A1*  5/2015 Ogawa ................ B41J 11/0015
                                                         428/201
2017/0365812 A1   12/2017 Choung et al.
2018/0138251 A1    5/2018 Kang
2018/0159089 A1    6/2018 Defranco et al.
2018/0292600 A1   10/2018 Lee et al.

FOREIGN PATENT DOCUMENTS

KR    10-2017-0142231 A    12/2017
KR       10-1803942 B1     12/2017
KR    10-2018-0054983 A     5/2018
KR    10-2020-0018747 A     2/2020

* cited by examiner

Primary Examiner — Monica D Harrison
(74) Attorney, Agent, or Firm — Lewis Roca Rothgerber Christie LLP

(57) ABSTRACT

A method of forming a pattern part includes forming a first film on a target object, the first film having a first cure shrinkage ratio, forming a second film on the first film, the second film having a second cure shrinkage ratio greater than the first cure shrinkage ratio, and patterning the first film and the second film to form a pattern.

23 Claims, 15 Drawing Sheets

PATTERN PART, METHOD FOR FORMING PATTERN PART AND METHOD FOR MANUFACTURING DISPLAY DEVICE USING SAME

CROSS-REFERENCE TO RELATED APPLICATION

Korean Patent Application No. 10-2018-0139977, filed on Nov. 14, 2018, in the Korean Intellectual Property Office, and entitled: "Pattern Part, Method for Forming Pattern Part and Method for Manufacturing Display Device Using Same," is incorporated by reference herein in its entirety.

BACKGROUND

1. Field

Embodiments relate to a pattern part, a method of forming the pattern part and a method of manufacturing a display device using the same.

2. Description of the Related Art

In manufacturing display devices, at least a portion of layers or patterns constituting the display devices may be formed by using a photolithography process. The photolithography process may include exposure, development and etching steps. In the exposure step, a mask and an exposure device that reflect the design of the pattern are used to form a photoresist pattern.

SUMMARY

Embodiments are directed to a method of forming a pattern part, the method including forming a first film on a target object, the first film having a first cure shrinkage ratio, forming a second film on the first film, the second film having a second cure shrinkage ratio greater than the first cure shrinkage ratio, and patterning the first film and the second film to form a pattern.

In an example embodiment, the pattern may include a first pattern formed by patterning the first film, and a second pattern formed by patterning the second film.

In an example embodiment, the method of forming a pattern part may further include a first curing step for curing the first film and the second film after forming the second film.

In an example embodiment, the method of forming a pattern part may further include a second curing step curing the pattern after forming the pattern.

In an example embodiment, the second curing step may include a first temperature curing step for curing the pattern at a first temperature, and a second temperature curing step for curing the pattern at a second temperature lower than the first temperature.

In an example embodiment, in the second curing step, a degree of shrinkage of the second pattern may be greater than a degree of shrinkage of the first pattern.

In an example embodiment, in the forming of the first film, the first film may be formed in a first thickness, and in the forming of the second film, the second film may be formed in a second thickness larger than the first thickness.

In an example embodiment, the first film may include a first monomer, the second film may include a second monomer, and a number of functional groups of the second monomer may be more than a number of functional groups of the second monomer.

In an example embodiment, the method of forming a pattern part may further include forming a third film on the second film, wherein the third film may be patterned in the forming of the pattern.

In an example embodiment, the third film may have a third cure shrinkage ratio greater than the second cure shrinkage ratio.

In an example embodiment, the first film may include a first monomer, the second film may include a second monomer, the third film may include a third monomer, a number of functional groups of the second monomer may be more than a number of functional groups of the first monomer, and a number of functional groups of the third monomer may be more than a number of functional groups of the second monomers.

In an example embodiment, the method of forming a pattern part may further include forming a sacrificial layer on the target object, wherein the first film may be formed on the sacrificial layer.

In an example embodiment, the method of forming a pattern part may further include patterning the sacrificial layer to form a sacrificial pattern after the forming of the pattern, wherein the sacrificial pattern may have an undercut shape with respect to the pattern.

In an example embodiment, a method of manufacturing a display device includes forming a circuit layer on a base layer, forming a pixel definition film configured to define a pixel region on the circuit layer, forming a sacrificial layer configured to cover the pixel definition film, forming a first film on the sacrificial layer, forming a second film including a material different from that of the first film, patterning the first film, the second film, and the sacrificial layer to form a first pattern, a second pattern and a sacrificial pattern, forming a light-emitting layer on the pixel region, and removing the first pattern, the second pattern, and the sacrificial pattern.

In an example embodiment, the first film may have a first cure shrinkage ratio, and the second film may have a second cure shrinkage ratio greater than the first cure shrinkage ratio.

In an example embodiment, the first film may include a first monomer, the second film may include a second monomer, and a number of functional groups of the second monomer may be more than a number of functional groups of the second monomer.

In an example embodiment, in the forming of the first film, the first film may be formed in a first thickness, and in the forming the second film, the second film may be formed in a second thickness larger than the first thickness.

In an example embodiment, the pixel region may be one of a plurality of pixel regions, the plurality of pixel regions may include first pixel regions, second pixel regions, and third pixel regions, and in the forming of the first pattern, the second pattern and the sacrificial pattern, the first pattern, the second pattern and the sacrificial pattern may be formed so as to cover all the first pixel regions and the second pixel regions and expose the third pixel regions.

In an example embodiment, the method of manufacturing a display device may further include curing the first pattern, the second pattern and the sacrificial pattern, wherein the curing includes a first temperature curing step for providing a first temperature, and a second temperature curing step for providing a second temperature lower than the first temperature.

In an example embodiment, the sacrificial pattern may have an undercut shape with respect to the first pattern.

In an example embodiment, a pattern part includes a sacrificial pattern disposed on a target object, a first pattern disposed on the sacrificial pattern and including a first monomer, and a second pattern disposed on the first pattern and including a second monomer having more functional groups than that of the first monomer.

In an example embodiment, a thickness of the second pattern may be larger than a thickness of the first pattern.

In an example embodiment, the sacrificial pattern may have an undercut shape with respect to the first pattern.

BRIEF DESCRIPTION OF THE DRAWINGS

Features will become apparent to those of skill in the art by describing in detail example embodiments with reference to the attached drawings in which.

DETAILED DESCRIPTION

Figure 1:
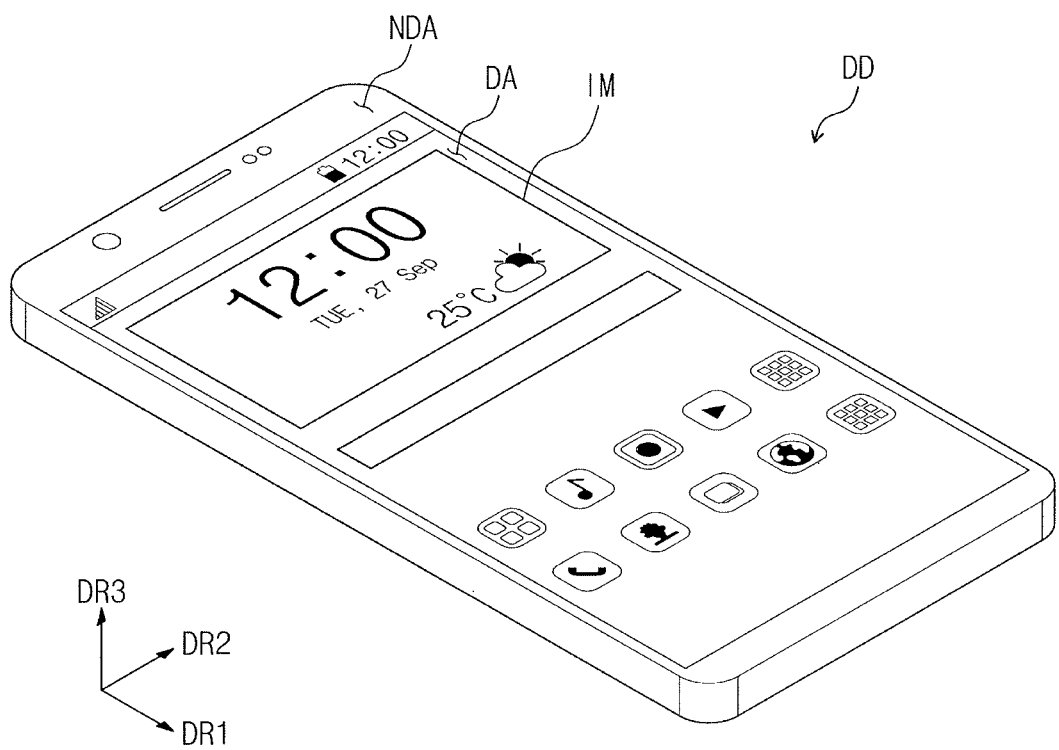
FIG. 1 illustrates a perspective view of a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

In this specification, it will be meant that when an element (or region, layer, portion, etc.) is referred to as being "on", "connected to" or "coupled to" another element, it may be directly on, connected or coupled to the other element or a third elements may be interposed therebetween.

The term "and/or" includes any of one or more combinations that may be defined by the associated listed items.

It will be understood that although the terms of first and second are used herein to describe various elements, these elements should not be limited by these terms. The above terms are only used to distinguish one component from other components. For example, a first element may be referred to as a second element and the second element may also be referred to as the first element without departing from the spirit and scope. The terms of a singular form may include plural forms unless clearly referred to the contrary.

In addition, terms, such as "under", "below", "on", "above" and the like, may be used herein to describe relationship between the elements illustrated in figures. The above terms are relative concepts, and described with respect to the direction indicated in figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that in the specification, the meaning of 'include' or 'have' specifies a property, a numeral, a step, an operation, an element or a combination thereof, but does not exclude other properties, numerals, steps, operations, elements or combinations thereof.

Hereinafter, example embodiments will be described in detail with reference to the accompanying drawings.

FIG. 1 is a perspective view of a display device DD according to an example embodiment.

Referring to FIG. 1, in a display device DD, a display region DA, and a non-display region NDA may be defined.

The display region DA in which an image IM is displayed is parallel to a plane defined by a first direction DR1 and a second direction DR2. The direction of the normal line of the display region DA, that is, the thickness direction of the display device DD, is indicated by a third direction DR3. The front surface (or upper surface) and the rear surface (or lower surface) of each of members are distinguished by the third direction DR3. However, the directions indicated by the first to third directions DR1, DR2 and DR3 are relative concepts, and may be converted into other directions. Hereinafter, the first to third directions are the directions indicated by the first to third directions DR1, DR2 and DR3, and may be referred to by the same reference numerals.

The display device DD may be used for large-sized electronic devices such as televisions, monitors, or external advertisement boards, and also be used for small and medium-sized electronic devices, such as personal computers, laptop computers, personal digital terminals, car navigation units, game machines, portable electronic apparatuses, and cameras. In addition, these are provided merely as examples, and the display device DD may also be used for other electronic apparatuses.

The non-display region NDA is a region adjacent to the display region DA and is a region in which any image IM is not displayed. A bezel region of the display device DD may be defined by the non-display region NDA.

The non-display region NDA may surround the display region DA. In another implementation, the shape of the display region DA and the shape of the non-display region NDA may be relatively designed.

Figure 2:
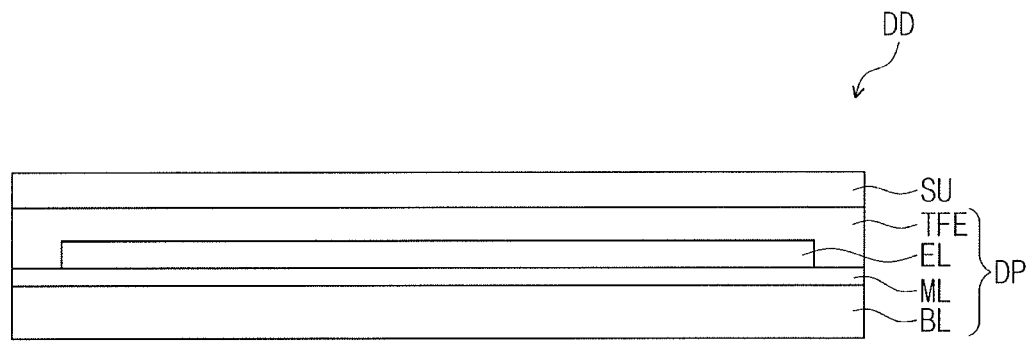
FIG. 2 illustrates a cross-sectional view of display device according to an example embodiment.
Figure 2:
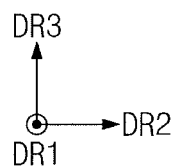

FIG. 2 is a cross-sectional view of a display device DD according to an example embodiment.

Referring to FIG. 2, the display device DD may include a display panel DP and a detection unit SU.

The display panel DP may include a base layer BL, a circuit layer ML, a light-emitting element layer EL, and a thin film encapsulation layer TFE., an organic light-emitting display panel is described as an example of the display panel DP.

The base layer BL may be a laminated structure including a silicon substrate, a plastic substrate, a glass substrate, an insulating film, or a plurality of insulating layers.

The circuit layer ML may be disposed on the base layer BL. The circuit layer ML may include a plurality of insulating layers, a plurality of conductive layers, and a semiconductor layer.

The light-emitting element layer EL may be disposed on the circuit layer ML. The light-emitting layer EL may include a display element, for example, an organic light-emitting diode. In another implementation, the light-emitting element layer EL may include an inorganic light-emitting diodes or organic-inorganic hybrid light-emitting diodes.

The thin film encapsulation layer TFE may encapsulate the light-emitting element layer EL. The thin film encapsulation layer TFE may include a plurality of inorganic layers and at least one organic layer interposed therebetween. In addition, the thin film encapsulation layer TFE may further include a buffer layer. The buffer layer may be the layer most adjacent to the detection unit SU. The buffer layer may be an inorganic layer or organic layer.

The detection unit SU may include a circuit that detects a touch. The touch detection method of the detection unit SU may include a resistive film method, an electrostatic capacitance method, an ultrasonic method, or the like. Among these, the electrostatic capacitance-type detection unit SU may detect whether a touch occurs by using electrostatic capacitance when a touch generation means contacts the screen of the display device DD. The electrostatic capacitance method may be divided into a mutual electrostatic capacitance method and a magnetic electrostatic capacitance method.

The detection unit SU may be directly disposed on the display panel DP. The term "directly disposed" means that attachment by using a separate adhesive member is excluded, and means formation by a continuous process. In another implementation, the display panel DP and the detection unit SU may be coupled to each other by using an adhesive member (not shown). In addition, in another embodiment, the detection unit SU may also be omitted.

Figure 3:
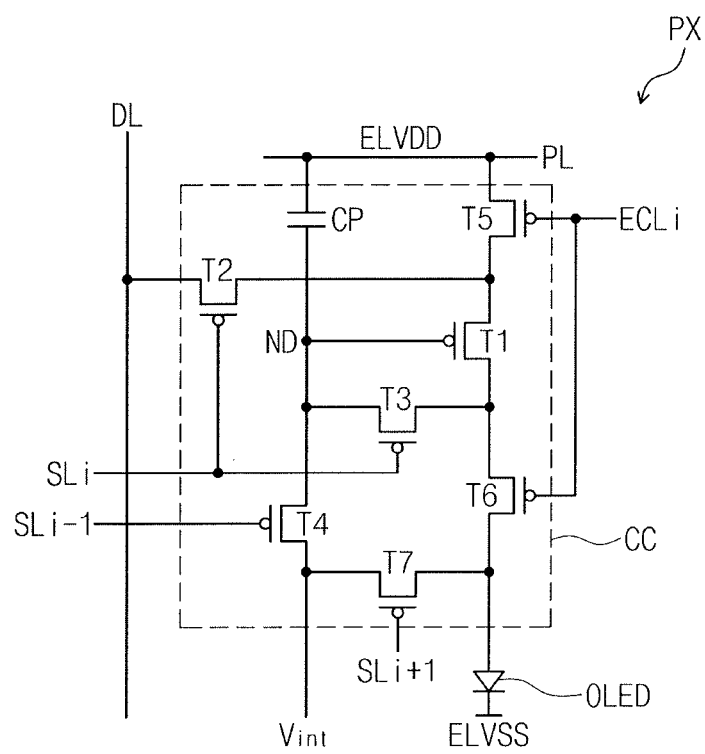
FIG. 3 illustrates an equivalent circuit diagram of a pixel according to an example embodiment.

FIG. 3 is an equivalent circuit diagram of a pixel PX according to an example embodiment. FIG. 3 exemplarily illustrates a pixel PX connected to an $i^{th}$ scan line (SLi) and $i^{th}$ emission control line ECLi.

The pixel PX may include an organic light-emitting element OLED and a pixel circuit CC. The pixel circuit CC may include a plurality of transistors T1 to T7 and a capacitor CP. The pixel circuit CC may control the quantity of current flowing through the organic light-emitting element OLED in response to a data signal.

The organic light-emitting element OLED may emit light at a predetermined brightness corresponding to the quantity of current provided from the pixel circuit CC. The level of a first power supply ELVDD may be set higher than the level of a second power supply ELVSS.

Each of the plurality of transistors T1 to T7 may include an input electrode (or source electrode), an output electrode (or drain electrode), and a control electrode (or gate electrode). For convenience, any one of the input electrode and the output electrode may be referred as a first electrode, and the other may be referred to as a second electrode.

In the present example embodiment, the first electrode of the first transistor T1 is connected to the first poser source ELVDD via the fifth transistor T5, and the second electrode of the first transistor T1 is connected to an anode electrode of the organic light-emitting element OLED via the sixth transistor T6. The first transistor T1 may be referred to as a drive transistor.

In the present example embodiment, the first transistor T1 controls the quantity of current flowing through the organic light-emitting element OLED corresponding to the voltage applied to the control electrode of the first transistor T1.

In the present example embodiment, the second transistor T2 is connected between a data line DL and the first electrode of the first transistor T1. In addition, a control electrode of the second transistor T2 is connected to an ith scan line SLi. The second transistor T2 is turned on when an ith scan signal is provided to the ith scan line SLi, and electrically connects the data line DL and the first electrode of the first transistor T1.

In the present example embodiment, the third transistor T3 is connected to the second electrode of the first transistor T1 and the control electrode of the first transistor T1. A control electrode of the third transistor T3 is connected to the ith scan line SLi. The third transistor T3 is turned on when the ith scan signal is provided to the ith scan line SLi, and electrically connects the second electrode of the first transistor T1 and the control electrode of the first transistor T1. Thus, when the third transistor T3 is turned on, the first transistor T1 is connected in the form of a diode.

In the present example embodiment, the fourth transistor T4 is connected between a node ND and an initial power generation part (not shown). In addition, a control electrode of the fourth transistor T4 is connected to an (i−1)th scan line SLi.−1. The fourth transistor T4 is turned on when an (i−1)th scan signal is provided to the (i−1)th scan line SLi−1, and provides the node ND with an initialization voltage Vint.

In the present example embodiment, the fifth transistor T5 is connected between a power supply line PL and the first electrode of the first transistor T1. The control electrode of the fifth transistor T5 is connected to an ith emission control line ECLi.

In the present example embodiment, the sixth transistor T6 is connected between the second electrode of the first transistor T1 and the anode electrode of the organic light-emitting element OLED. In addition, the control electrode of the sixth transistor T6 is connected to an ith emission control line ECLi.

In the present example embodiment, the seventh transistor T7 is connected between the initialization power generation part (not shown) and the anode electrode of the organic light-emitting element OLED. In addition, a control electrode of the second transistor T7 is connected to an (i+1)th can line SLi+1. Such the seventh transistor T7 is turned on when an (i+1)th scan signal is provided to the (i+1)th scan line SLi+1, and provides an initialization voltage Vint to the anode electrode of the organic light-emitting element OLED.

In the present example embodiment, the seventh transistor T7 may improve the black representation capability of the pixel PX. Specifically, when the seventh transistor T7 is turned on, a parasitic capacitor (not shown) of the organic light-emitting element OLED is discharged. Then, when implementing a black brightness, the organic light-emitting element OLED does not emit light due to a leak current from the first transistor T1, and thus, the black representation capability may be improved.

FIG. 3 illustrates an example in which the control electrode of the seventh transistor T7 is connected to the $(i+1)^{th}$ scan line SLi+1. In another example embodiment, the control electrode of the seventh transistor T7 may be connected to the $i^{th}$ scan line SLi or to the $(i-1)^{th}$ scan line SLi−1.

FIG. 3 is shown with respect to a PMOS. In another example embodiment, the pixel circuit CC may be configured as an NMOS. In another example embodiment, the pixel circuit may be configured by a combination of the NMOS and PMOS.

In the present example embodiment, the capacitor CP is disposed between the power supply line PL and the node ND. The capacitor CP stores a voltage corresponding to a data signal. According to the voltage stored in the capacitor CP, when the fifth transistor T5 and the sixth transistor T6 are turned on, the quantity of current flowing through the first transistor T1 may be determined.

The structure of the pixel PX illustrated in FIG. 3 is an example. In another example embodiment, the pixel PX may be implemented in various shapes for allowing the organic light-emitting element OLED to emit light.

Figure 4A:
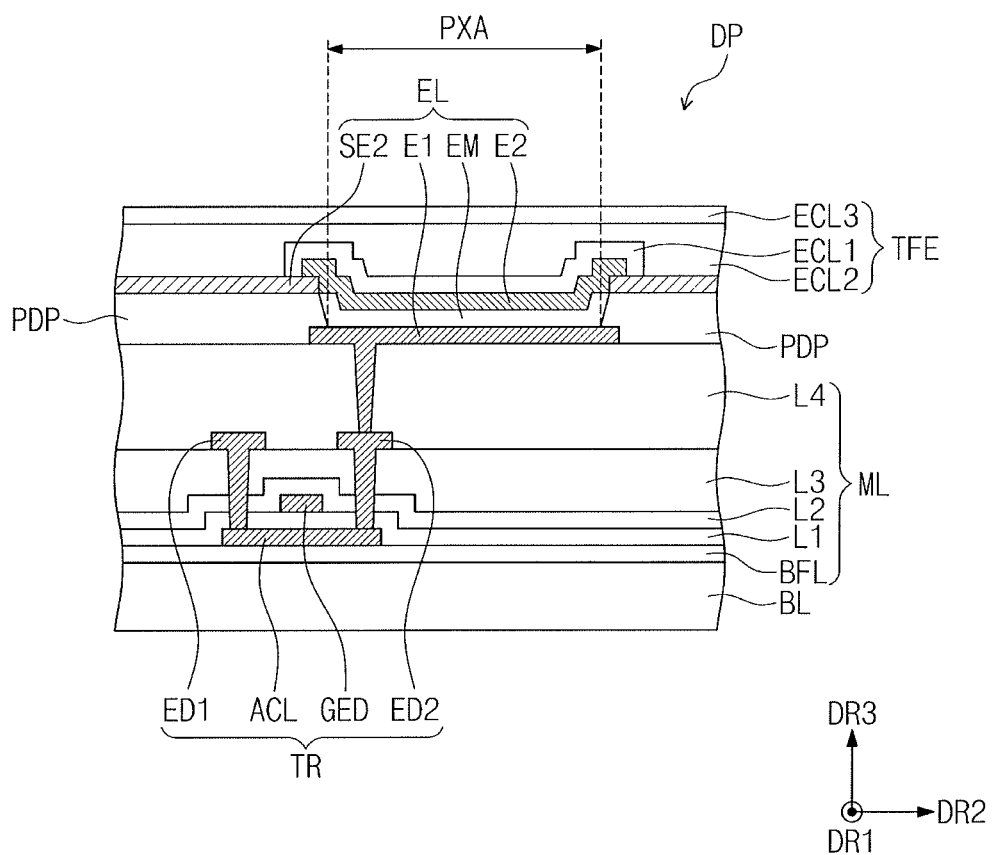
FIG. 4A illustrates a cross-sectional view of some configurations of a display panel according to an example embodiment.
Figure 4B:
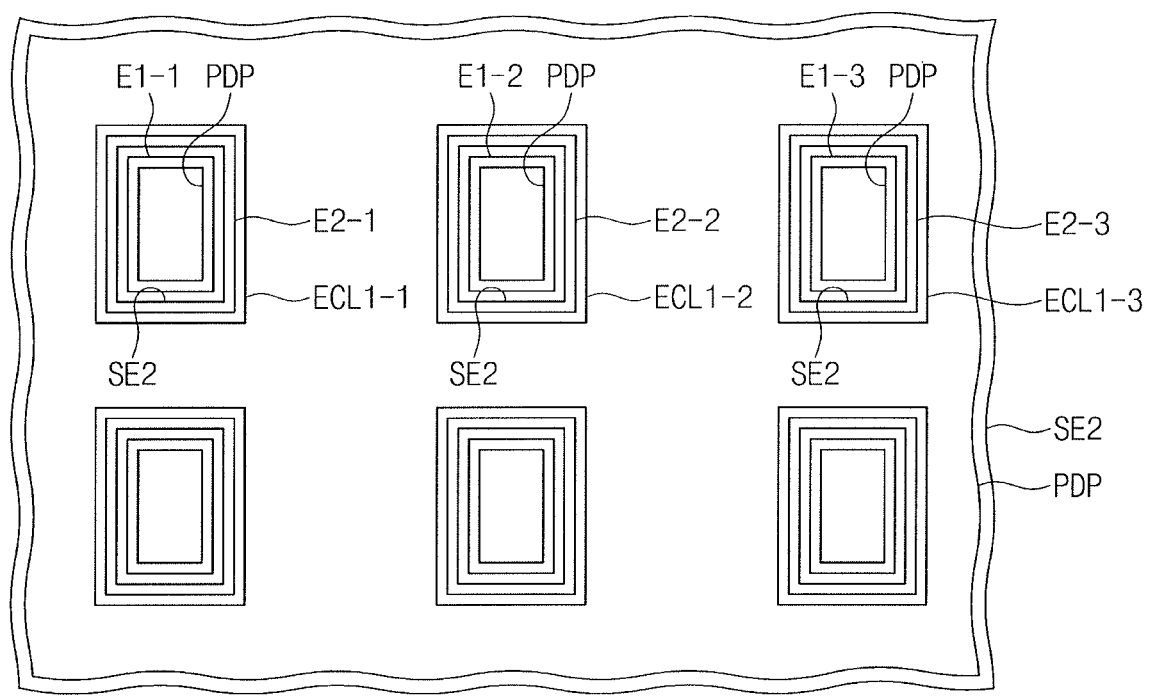
FIG. 4B illustrates a plan view of some configurations of a display panel according to an example embodiment.

FIG. 4A is a cross-sectional view illustrating some configurations of a display panel according to an example embodiment. FIG. 4B is a plan view illustrating some configurations of a display panel according to an example embodiment.

Referring to FIGS. 4A and 4B, the display panel DP may include a base layer BL, a circuit layer ML, a light-emitting element layer EL, and a thin film encapsulation layer TFE.

The circuit layer ML may include a transistor TR and a plurality of insulating layers BFL, L1, L2, L3, and L4.

The insulating layer BFL may be disposed on the base layer BL, and the transistor TR may be disposed on the insulating layer BFL. The transistor TR of FIG. 4A may be the first transistor T1 illustrated in FIG. 3. The transistor TR may include a semiconductor layer ACL, a control electrode GED, a first electrode EDI, and a second electrode ED2.

The semiconductor layer ACL may be disposed on the insulating layer BFL. The insulating layer BFL may be a buffer layer that provides a modified surface to the semiconductor layer ACL. In this case, the semiconductor layer ACL may have higher adhesion to the insulating layer BFL than the base layer BL. In addition, the insulating layer BFL may be a barrier layer that protects the lower surface of the semiconductor layer ACL. In this case, the insulating layer BFL may prevent contaminants, moisture and the like from permeating into the base layer BL itself and through the base layer BL. Alternatively, the insulating layer BFL may be a light-blocking layer that blocks external light, which is incident through the base layer BL, to be incident to the semiconductor layer ACL. In this case, the insulating layer BFL may further include a light-blocking material.

The semiconductor layer ACL may include polysilicon or amorphous silicon.

The semiconductor layer ACL may include a metal oxide semiconductor. The semiconductor layer ACL may include a channel region that functions as a passage through which electrons or holes may move, and a first ion doped region and a second ion doped region that are disposed with the channel region therebetween.

The first insulating layer L1 may be disposed on the insulating layer and may cover the semiconductor layer ACL. The first insulation layer L1 may include an inorganic material. The inorganic material may include at least any one among silicon nitride, silicon oxy nitride, silicon oxide, titanium oxide, or aluminum oxide.

The control electrode GED may be disposed on the first insulating layer L1. The second insulating layer L2 may be disposed on the first insulating layer L1 and may cover the control electrode GED. The second insulation layer L2 may include an inorganic material.

The third insulating layer L3 may be disposed on the second insulating layer L2. The first electrode ED1 and the second electrode ED2 may be disposed on the third insulating layer L3. The first and second electrodes ED1 and ED2 may be connected to the semiconductor layer ACL via through holes passing through the first insulation layer L1, the second insulating layer L2, and the third insulating layer L3.

The fourth insulating layer L4 may be disposed on the third insulating layer L3 and may cover the first electrode ED1 and the second electrode ED2. The fourth insulating layer L4 may be composed of a single layer or a plurality of layers. For example, the single layer may include an organic layer. The plurality of layers may be provided by a laminate of an organic layer and an inorganic layer. The fourth insulating layer L4 may be a flattened layer providing a flattened surface thereon.

A light-emitting element layer EL and a pixel definition film PDP may be disposed on the fourth insulating layer L4.

The light-emitting element layer EL may include a first electrode E1, a light-emitting layer EM, a second electrode E2, and an auxiliary electrode SE2. The first electrode E1 may be disposed on the fourth insulating layer L4, and may be electrically connected to the second electrode ED2 through a through hole passing through the fourth insulating layer L4.

The pixel definition film PDP may be disposed on the circuit layer ML and define a pixel region PXA. The pixel definition film PDP covers at least a portion of the first electrode E1 and may be disposed on the fourth insulating layer L4. A portion of the first electrode E1 may not be covered by the pixel definition film PDP, and the portion may correspond to the pixel region PXA.

The light-emitting layer EM may be disposed between the first electrode E1 and the second electrode E2. The light-emitting layer EM may have a single layer structure formed of a single material, a single layer structure formed of a plurality of materials different from each other, or a multi-layer formed of a plurality of layers composed of a plurality of materials different from each other.

The light-emitting layer EM may include an organic material. For example, the light-emitting layer EM may be composed of at least any one material among materials that emit red, green, or blue, and may include a fluorescent material or a phosphorescent material.

The second electrode E2 may be disposed on the light-emitting layer EM, and the auxiliary electrode SE2 may be disposed on the pixel definition film PDP. The second electrode E2 and the auxiliary electrode SE may receive a second power supply ELVSS (see FIG. 3).

The second electrode E2 may be provided in plurality, and the plurality of second electrodes E2-1, E2-2, and E2-3 may be spaced apart from each other. The second electrodes E2-1, E2-2, and E2-3 may be electrically connected through the auxiliary electrode SE2.

A thin film encapsulation layer TFE may be disposed on the second electrode E2 and the auxiliary electrode SE2. The thin film encapsulation layer TFE may directly cover the second electrode E2 and the auxiliary electrode SE2.

The thin film encapsulation layer TFE may include a first inorganic layer ECL1, an organic layer ECL2, and a second inorganic layer ECL3 that are sequentially laminated.

The first inorganic layer ECL1 may cover the second electrode E2. The first inorganic layer ECL1 may be provided in plurality. The plurality of first inorganic layers ECL1-1, ECL1-2, and ECL1-3 may one-to-one correspond to the second electrodes E2-1, E2-2, and E2-3 and cover the second electrodes E2-1, E2-2, and E2-3.

The organic layer ECL2 may cover the first inorganic layers ECL1-1, ECL1-2, and ECL1-3. The organic layer ECL2 may be formed by depositing, printing, or coating an organic material. The second inorganic layer ECL3 may be disposed on the organic layer ECL2.

The first inorganic layer ECL1 and the second inorganic layer ECL3 may protect the light-emitting element layer EL from moisture and oxygen, and the organic layer ECL2 may protect the light-emitting element layer EL from foreign materials such as dust particles. The first inorganic layer and the second inorganic layer ECL3 may include at least any one among silicon nitride, silicon oxy nitride, silicon oxide, titanium oxide, or aluminum oxide. The organic layer ECL2 may include a polymer, for example, an acryl-based organic layer.

FIG. 4A exemplarily illustrates that the thin film encapsulation layer TFE includes two inorganic layers and one organic layer. For example, the thin film encapsulation layer TFE may also include three inorganic layers and two organic layers, and in this case, and may have a laminated structure in which the inorganic layers and the organic layer are alternately laminated.

FIGS. 5A to 5G are views illustrating some of manufacturing processes of a display device according to an example embodiment. In describing FIGS. 5A to 5G, the reference numerals described in FIG. 4A will be used likewise, and a repeated description thereof may be omitted for clarity.

Figure 5A:
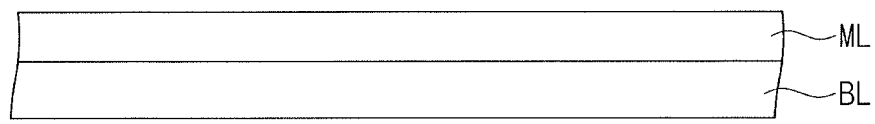
FIGS. 5A to 5G illustrate views of some of manufacturing processes of a display device according to an example embodiment.
Figure 5A:
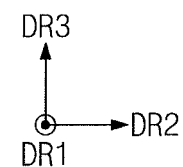

Referring to FIG. 5A, a circuit layer ML is formed on a base layer BL.

Figure 5B:
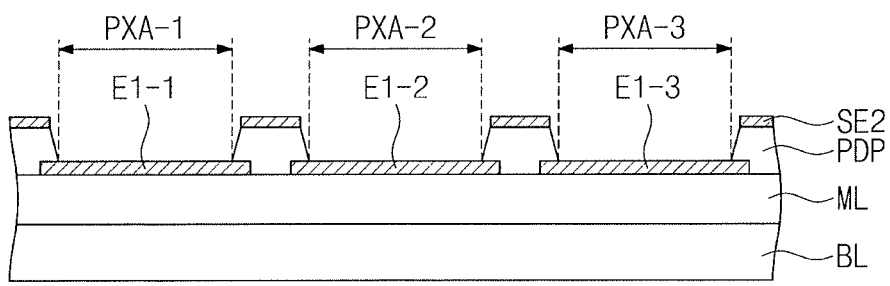
Figure 5B:
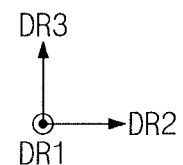

Referring to FIG. 5B, first electrodes E1-1, E1-2, and E1-3 are formed on the circuit layer ML. The first electrode El shown in FIG. 4A may be any one of first electrodes E1-1, E1-2, and E1-3.

A pixel definition film PDP is formed on the circuit layer ML. The pixel definition film PDP may cover at least a portion of the first electrodes E1-1, E1-2, and E1-3. Some regions that are not covered by the pixel definition layer PDP and exposed in the first electrode electrodes E1-1, E1-2, and E1-3 may be defined as pixel regions PXA-1, PXA-2, and PXA-3. The pixel regions PXA-1, PXA-2, and PXA-3 may be divided into a first pixel region PXA-1, a second pixel region PXA-2, and a third pixel region PXA-3.

An auxiliary electrode SE2 is formed on the pixel definition film PDP. The auxiliary electrode SE2 may include a conductive material. For example, the auxiliary electrode SE2 may include molybdenum.

Figure 5C:
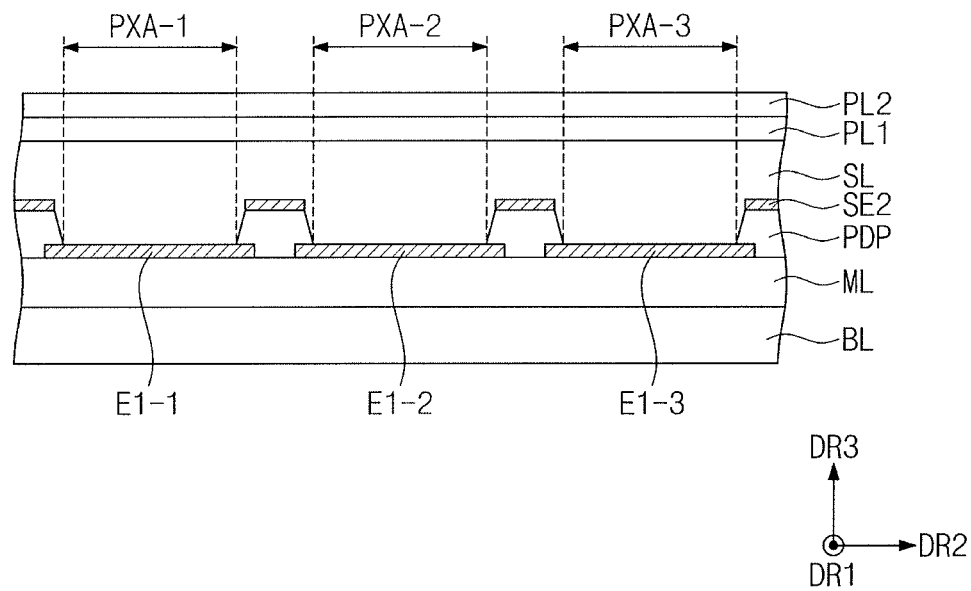

Referring to FIG. 5C, a sacrificial layer SL is formed to cover the pixel definition film PDP and the first electrodes E1-1, E1-2, and E1-3. The sacrificial layer SL may include, for example, an organic fluorine-based resin.

A first film PL1 is formed on the sacrificial layer SL. A second film PL2 is formed on the first film PL1. The first film PL1 and the second film PL2 may include respective photosensitive chemical materials. After the first film PL1 and the second film PL2 are formed, the first film PL1 and the second film PL2 may be cured.

The first film PL1 may have a first cure shrinkage ratio and a second film PL2 may have a second cure shrinkage ratio. The second cure shrinkage ratio may be greater than the first cure shrinkage ratio. As each of the first film PL1 and the second film PL2 is cured, volume shrinkage may occur while a solvent in the photosensitive chemical material is removed. The first and second cure shrinkage ratios may indicate a volume shrinkage ratio during a cure reaction.

The first film PL1 and the second film PL2 may include materials different from each other. For example, the first film PL1 and the second film PL2 may include or be formed using different monomers that have mutually different numbers of functional groups. The greater the number of functional groups of a monomer, the greater the cure shrinkage ratio may be. Thus, the first film PL1 may include a monomer having x number of functional groups. x may be a positive integer. The second film PL2 may include or be formed using a monomer having y number of functional groups, and y may be an integer greater than x.

In an example embodiment, a material for increasing the cure shrinkage ratio may be added to the second film PL2 so that the second cure shrinkage ratio is higher than the first cure shrinkage ratio of the first film PL1.

Figure 5D:
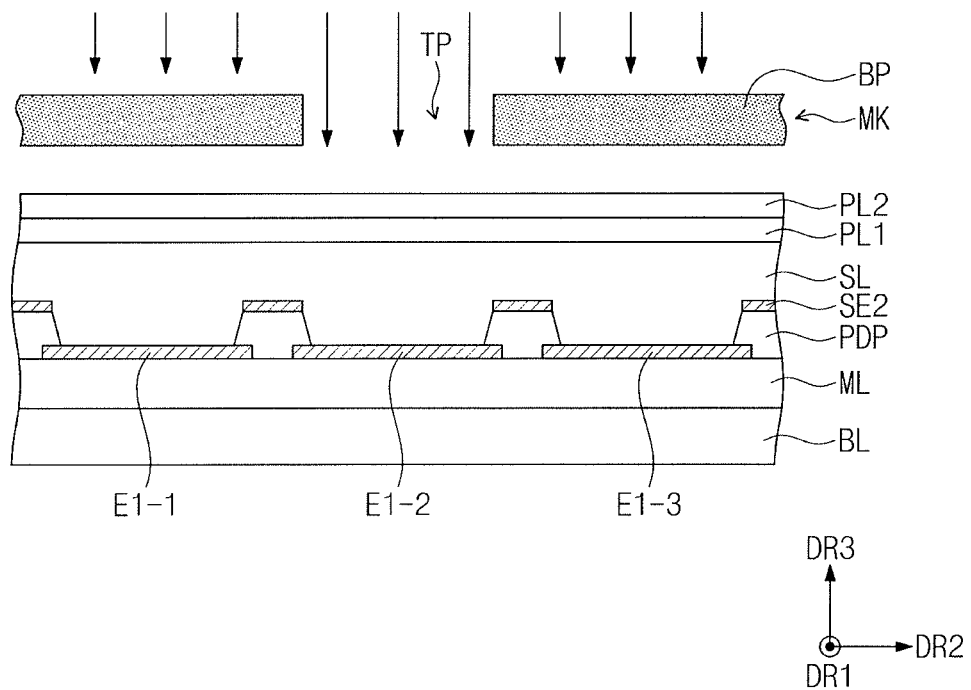

Referring to FIG. 5D, a mask MK is disposed on the second film PL2. The mask MK may be a binary mask including a light-transmitting part TP and a light-blocking part BP.

Each of the first film PL1 and the second film PL2 may be a positive photoresist film or a negative photoresist film. Hereinafter, an embodiment is described in which the first film PL1 and the second film PL2 are positive photoresist films.

The light-blocking part BP may overlap the first pixel region PXA-1 and the third pixel region PXA-3. The light-transmitting part TP may overlap the second pixel region PXA-2. Light is emitted after the mask MK is disposed on the second film PL2.

Figure 5E:
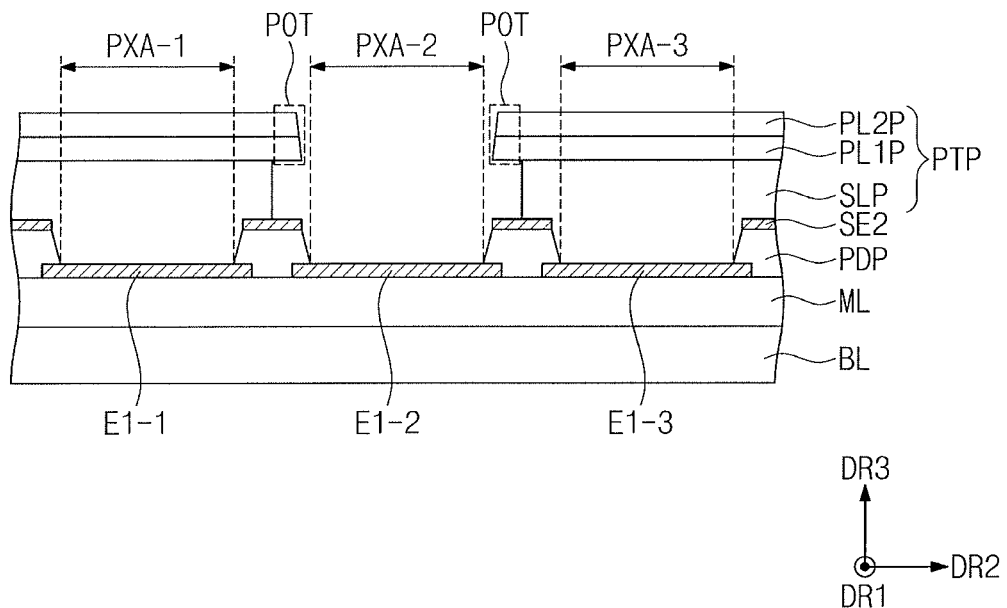

Referring to FIG. 5E, a first pattern PL1P may be formed by patterning the first film PL1, and the second pattern PL2P may be formed by patterning the second film PL2. The patterning may include an exposure process and a development process. The first pattern PL1P and the second pattern PL2P may be simultaneously formed through the same process. The patterns including both the first pattern PL1P and the second pattern PL2P may be referred to as patterns.

After the first pattern PL and the second pattern PL2P are formed, the sacrificial layer SL may be patterned to form the sacrificial pattern SLP. Thus, a pattern part PTP including the first pattern PL1P, the second pattern PL2P and the sacrificial pattern SLP may be formed.

The sacrificial pattern SLP may have an undercut shape with respect to the first pattern PL1P. Thus, a portion POT of each of the first pattern PL1P and the second pattern PL2P may not be supported by the sacrificial pattern SLP.

According to the present example embodiment, the cure shrinkage ratio of the second pattern PL2P is greater than the cure shrinkage ratio of the first pattern PL1P. Thus, the first pattern PL1P may receive a force pulling toward the second pattern PL2P. Thus, even when the one portion POT is not supported by the sacrificial pattern SLP, a phenomenon may be prevented in which the one portion POT is deflected, e.g., pattern sag of the overhang may be reduced or prevented.

By the method described herein, light-emitting layers that emit light having different colors from each other may respectively formed in the first pixel region PXA-1, the second pixel region PXA-2, and the third pixel region PXA-3. For example, a red light-emitting layer, a green light-emitting layer, and a blue light-emitting layer may be formed respectively on the first pixel region PXA-1, the second pixel region PXA-2, and the third pixel region PXA-3. The green light-emitting layer may be formed first, as will now be described.

Figure 5F:
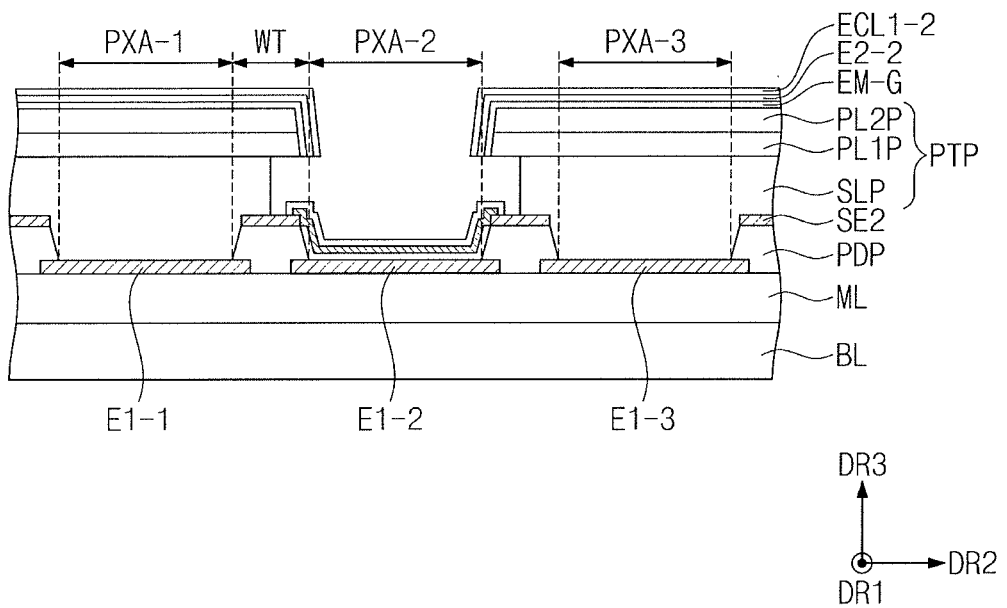

In FIG. 5F, the first pixel region PXA-1 and the third pixel region PXA-3 except for the second pixel region PXA-2 may be covered by the sacrificial pattern SLP. According to an example embodiment, other regions except for a specific pixel region, e.g., the second pixel region PXA-2, may be covered by the sacrificial pattern SLP.

As shown in FIG. 5F, a light-emitting layer EM-G, e.g., a green light-emitting layer, may be initially formed in the exposed second pixel region PXA-2, as well as the first pixel region PXA-1 and the third pixel region PXA-3, but since the first pixel region PXA-1 and the third pixel region PXA-3 are covered by the sacrificial pattern SLP, the light-emitting layer EM-G may be removed therewith, as described below.

According to an example embodiment, when the light-emitting layer EM-G is formed, pixel regions other than the second pixel region PXA-2 may be covered by the sacrificial pattern SLP. Thus, even when the distance between, for example, the first pixel region PXA-1 and the second pixel region PXA-2 is reduced, a light-emitting layer that emits different light to adjacent pixel regions may ultimately not be present on the adjacent pixel regions. Consequently, the area of each of the first to third pixel regions PXA-1, PXA-2, and PXA-3 may be expanded, and the width WT of the pixel definition film PDP may be reduced. For example, the width WT of the pixel definition film PDP may be reduced to be about 6 micrometers or less.

Still referring to FIG. 5F, after the light-emitting layer EM-G is formed, a second electrode E2-2 may be formed. The second electrode E2-2 may contact the auxiliary electrode SE2. The second electrode E2-2 may include a conductive material. The second electrode E2-2 may include a multilayer structure or a single-layer structure. When the second electrode E2-2 is a multilayer structure, the second electrode E2-2 may include a first electrode layer and a second electrode layer. The first electrode layer may contain an Ag-Mg alloy, and the second electrode may contain an indium tin oxide (ITO). In an example embodiment, the first electrode layer and the second electrode layer may be in direct contact with each other, the first electrode may not contact with the auxiliary electrode SE2, and the first electrode layer may be electrically connected to the auxiliary electrode SE2 through the second electrode layer. In another example embodiment, the first electrode layer and the auxiliary electrode SE-2 may be in direct contact with each other.

After the second electrode E2-2 is formed, a first inorganic layer ECL1-2 may be formed. The first inorganic layer ECL1-2 may include an inorganic material. The inorganic material may be, for example, silicon nitride.

Figure 5G:
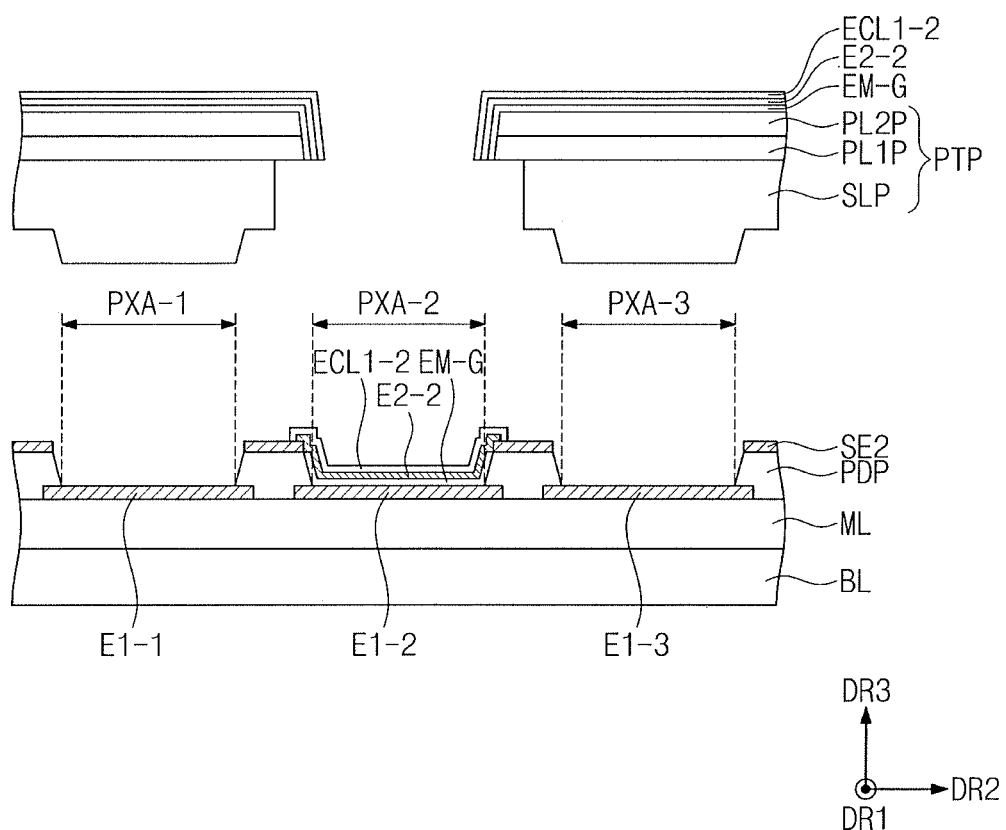

Referring to FIG. 5G, materials may be removed from the adjacent pixel regions. For example, an etchant may be provided to the sacrificial pattern SLP, so that the sacrificial pattern SLP, the first pattern PL1P, and the second pattern PL2P may be removed. The etchant may be, for example, an organic fluorine-based solvent.

The processes of FIGS. 5C to 5G, may also be performed likewise with respect to the first pixel region PXA-1 and the third pixel region PXA-3 so as to form, e.g., red and blue light-emitting regions.

Figure 6:
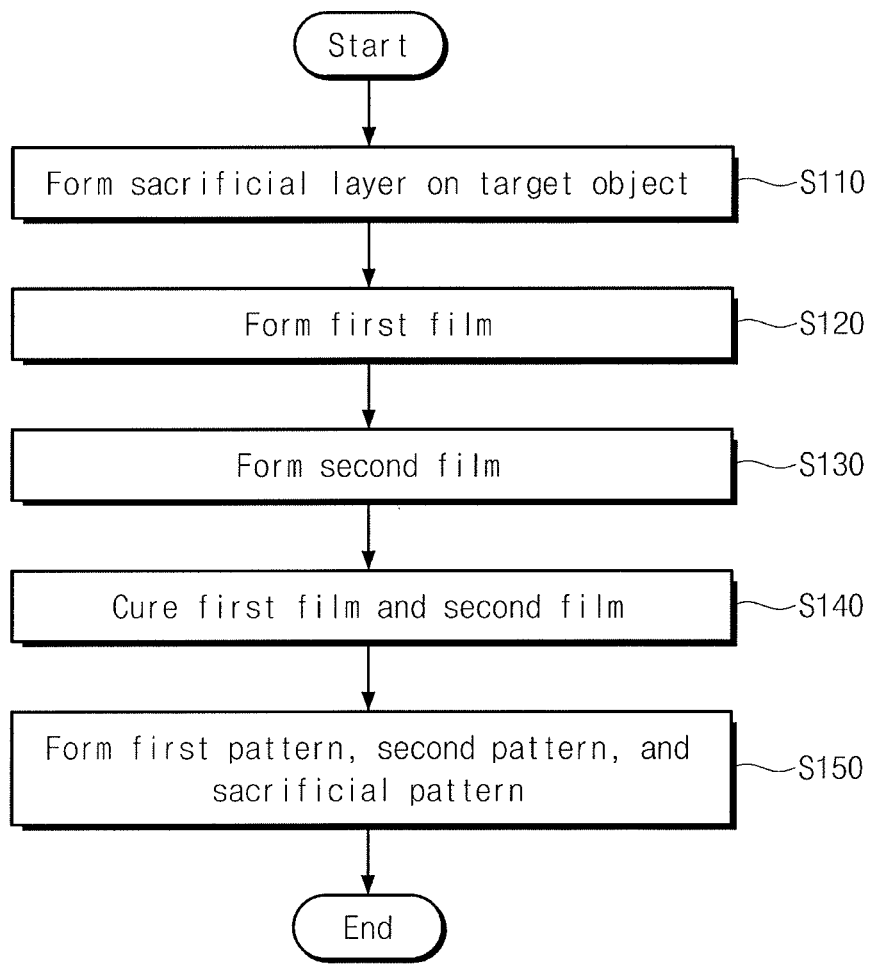
FIG. 6 illustrates a flowchart of a process described through FIGS. 5A to 5E.

FIG. 6 is a flowchart of a process described through FIGS. 5A to 5E.

Referring to FIGS. 5A to 5E and FIG. 6, a sacrificial layer SL is formed on a target object (S110). The target object may be a display panel in a manufacturing step illustrated in FIG. 5B.

A first film PL1 is formed on the sacrificial layer SL (S120). A second film PL2 is faulted on the first film PL1. The first film PL1 and the second film PL2 are cured (S140). Subsequently, through a patterning process, the first pattern PL1P, the second pattern PL2P, and the sacrificial pattern SLP are formed (S150).

In FIG. 6, a step was described in which both the first film PL1 and the second film PL2 are formed and then cured. For example, the first film PL1 is formed and then firstly cured, and then the second film PL2 is formed and second curing may be performed.

Figure 7A:
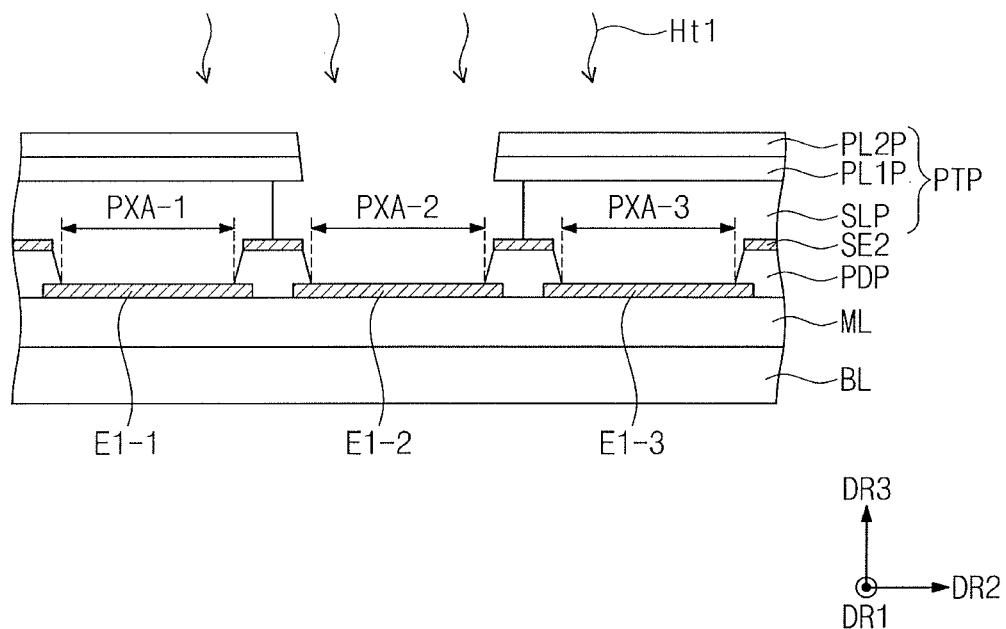
FIGS. 7A and 7B illustrate views of some of manufacturing processes of a display device according to an example embodiment.
Figure 7B:
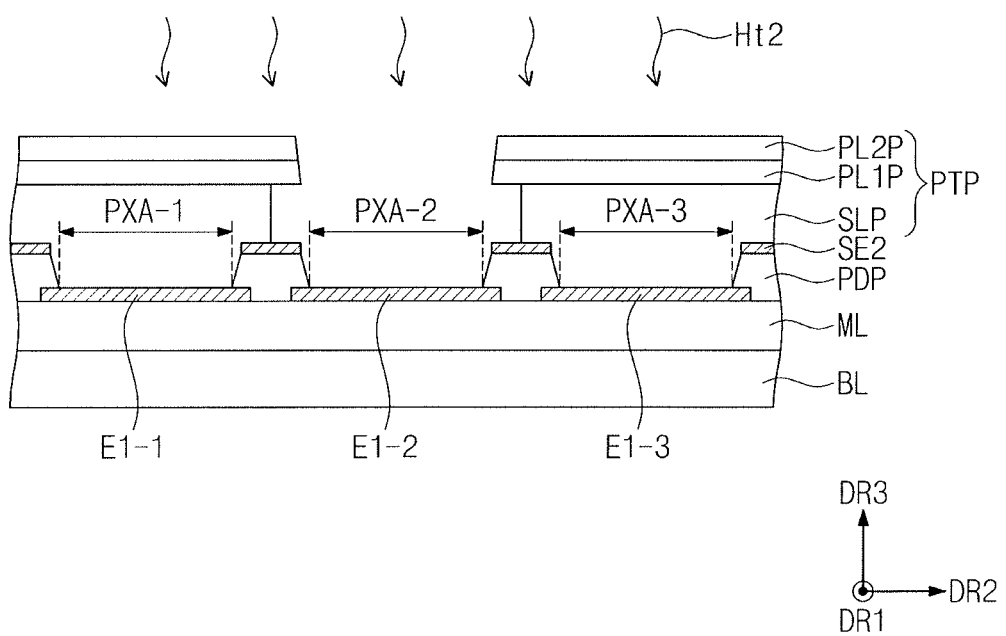
Figure 8:
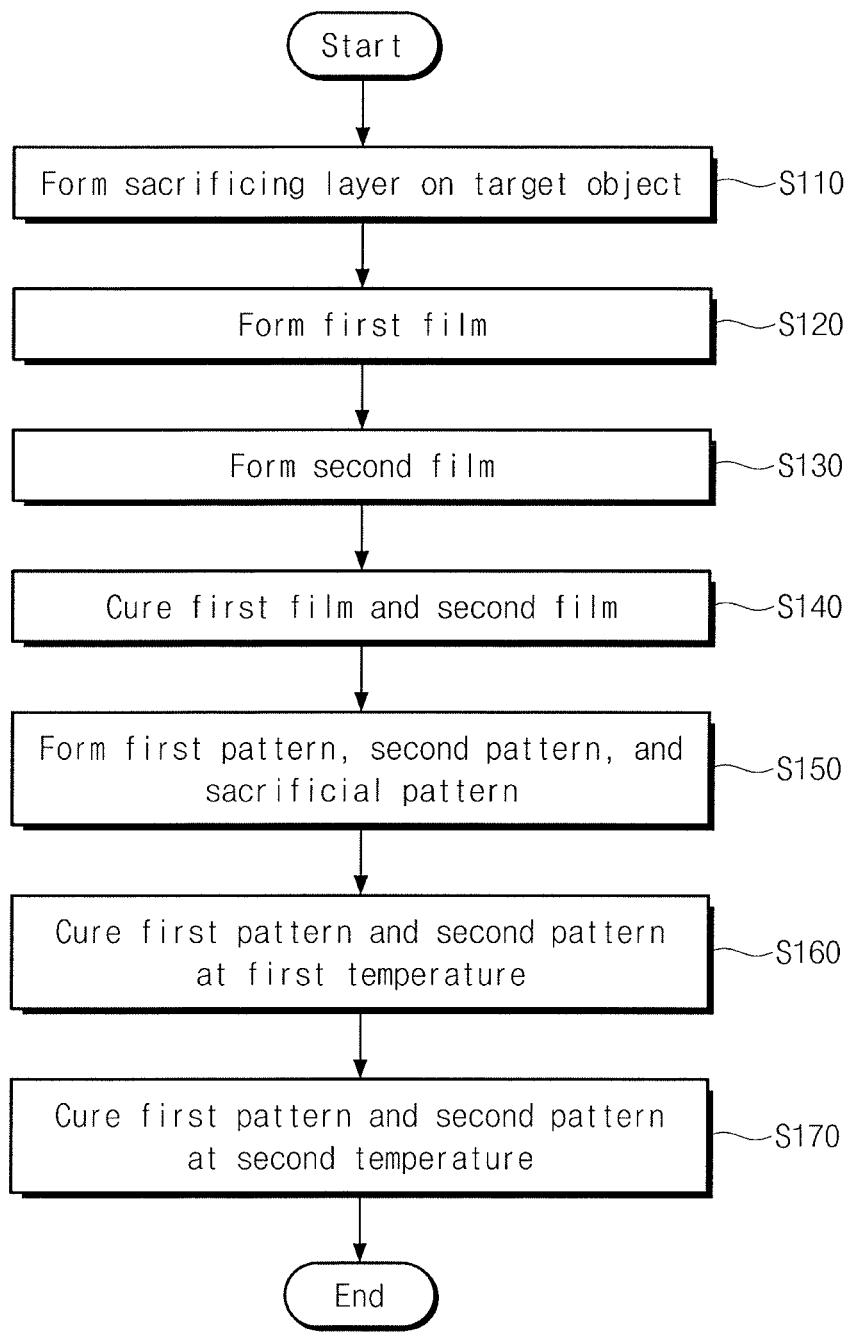
FIG. 8 illustrates a flowchart of a pattern formation method including processes illustrated in FIGS. 7A and 7B.

FIGS. 7A to 7B are views illustrating some of manufacturing processes for a display device according to an example embodiment. FIG. 8 is a flowchart of a pattern formation method including processes illustrated in FIGS. 7A and 7B.

Referring to FIGS. 7A, 7B, and 8, curing a first pattern PL1P and a second pattern PL2P at a first temperature Ht1 (S160), and curing the first pattern PL1P and the second pattern PL2P at a second temperature Ht2 (S170) may further be provided.

The first temperature Ht1 may be a temperature higher than the second temperature Ht2. For example, the first temperature Ht1 may be about 80 degrees Celsius, and the second temperature Ht2 may be about 70 degrees Celsius.

When the first temperature Ht1 is applied on the second pattern PL2P, the second pattern PL2P may be closer to a heat source than the first pattern PL1P. Thus, heat may be firstly transferred more quickly to the second pattern PL2P than to the first pattern PL1P. When the temperature is higher under the same condition, the cure shrinkage ratio may further increase. Accordingly, the second pattern PL2P may be contracted, and contracted to a greater extent than the first pattern PL1P, so that the first pattern PL may receive a force in a direction, e.g., in a lateral direction, oriented toward the contracting direction of the second pattern PL2P. Subsequently, heat may be applied at the second temperature Ht2 lower than the first temperature Ht1.

The curing of the first film PL1 and the second film PL2 (S140) may be referred to as a first curing step, and the curing of the first pattern PL1P and the second pattern PL2P at the first temperature Ht1 (S160) and the curing of the first pattern PL1P and the second pattern PL2P at the second temperature Ht2 (S170) may be referred to as a second curing step.

Figure 9A:
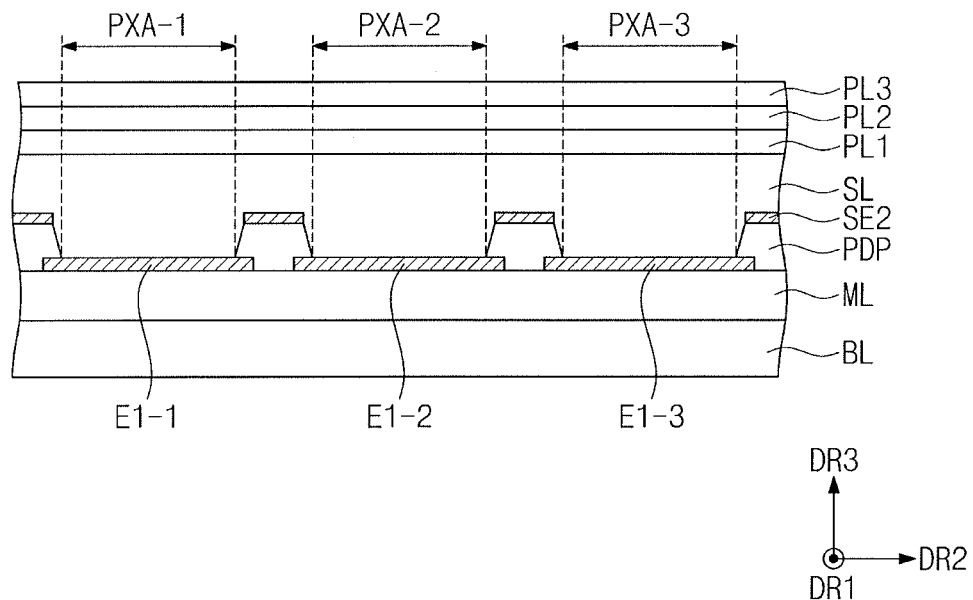
FIGS. 9A and 9B illustrate views of some of manufacturing processes of a display device according to an example embodiment.
Figure 9B:
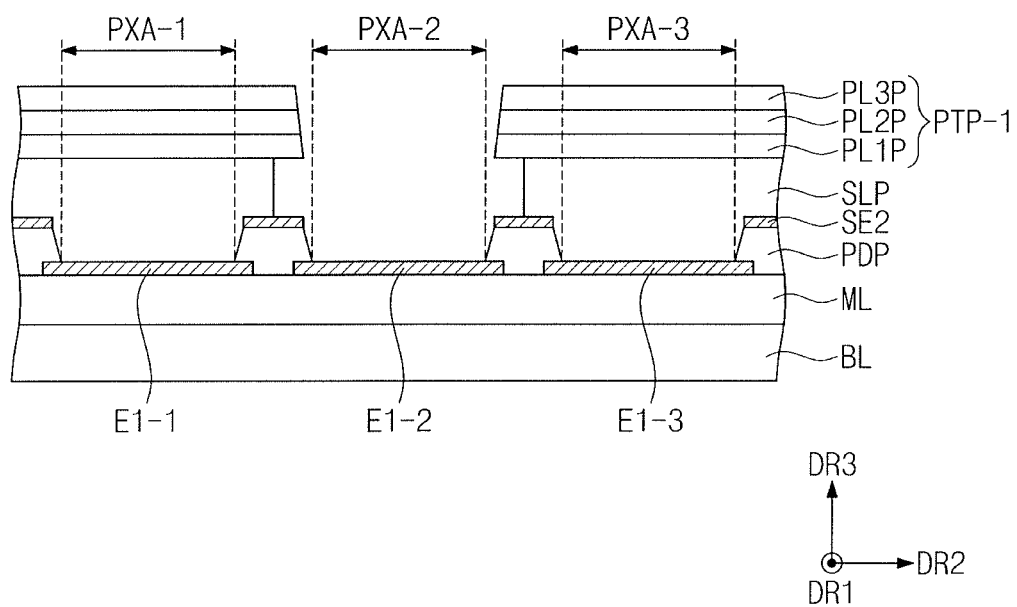

FIGS. 9A to 9B are views illustrating some of manufacturing processes for a display device according to an example embodiment. In describing FIGS. 9A and 9B. the components described through FIGS. 5A to 5G are described by the same reference numerals, and the description thereon will not be provided.

Referring to FIG. 9A, the sacrificial layer SL that covers the pixel definition film PDP and the first electrodes E1-1, E1-2, and E1-3 are formed. A first film PL1 is formed on the sacrificial layer SL. A second film PL2 is formed on the first film PL1. A third film PL3 is formed on the second film PL2.

The first film PL1 may have a first cure shrinkage ratio, a second film PL2 may have a second cure shrinkage ratio, and a third film PL3 may have a third cure shrinkage ratio. The second cure shrinkage ratio may be greater than the first cure shrinkage ratio. The third cure shrinkage ratio may be greater than the second cure shrinkage ratio.

The first film PL1, the second film PL2, and the third film PL3 may include materials different from each other. For example, the first film PL1, the second film PL2, and the third film PL3 may respectively include a monomer having mutually different numbers of functional groups. The greater the number of functional groups of the monomer, the greater the cure shrinkage ratio may be. Thus, the first film PL1 may include a monomer having x number of functional groups, where x may be a positive integer. The second film PL2 may include a monomer having y number of functional groups, where y may be an integer greater than x. The third film PL3 may include a monomer having z number of functional groups, where z may be an integer greater than y.

Referring to FIG. 9B, a pattern part PTP-1 is formed by patterning the sacrificial layer SL, the first film PL1, the second film PL2, and the third film PL3. The pattern part PTP-1 may include the sacrificial pattern SLP, the first pattern PL1P, the second pattern PL2P, and the third pattern PL3P.

Figure 10A:
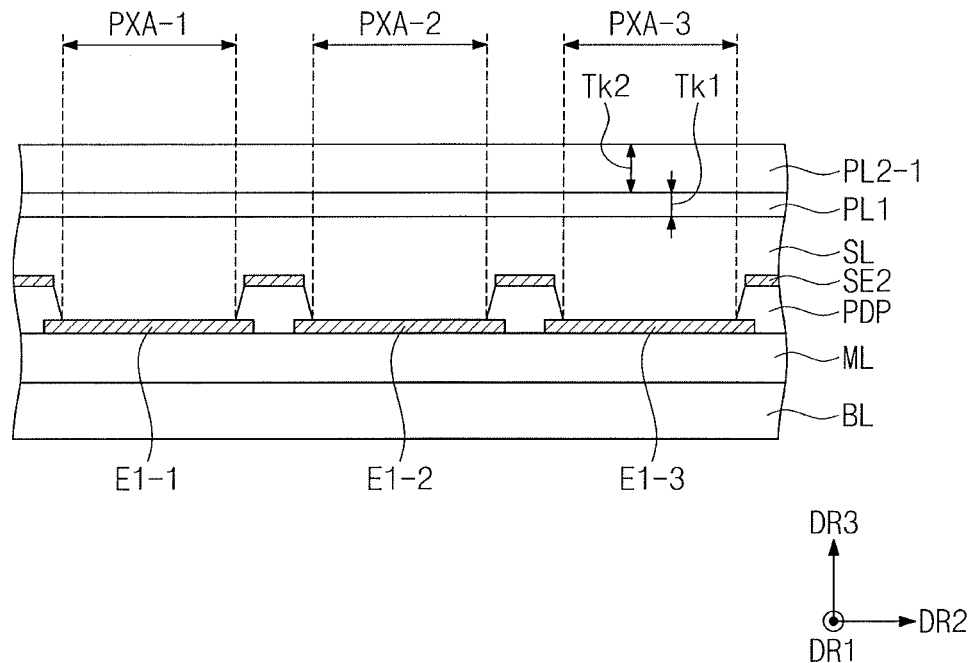
FIGS. 10A and 10B illustrate views of some of manufacturing processes of a display device according to an example embodiment.
Figure 10B:
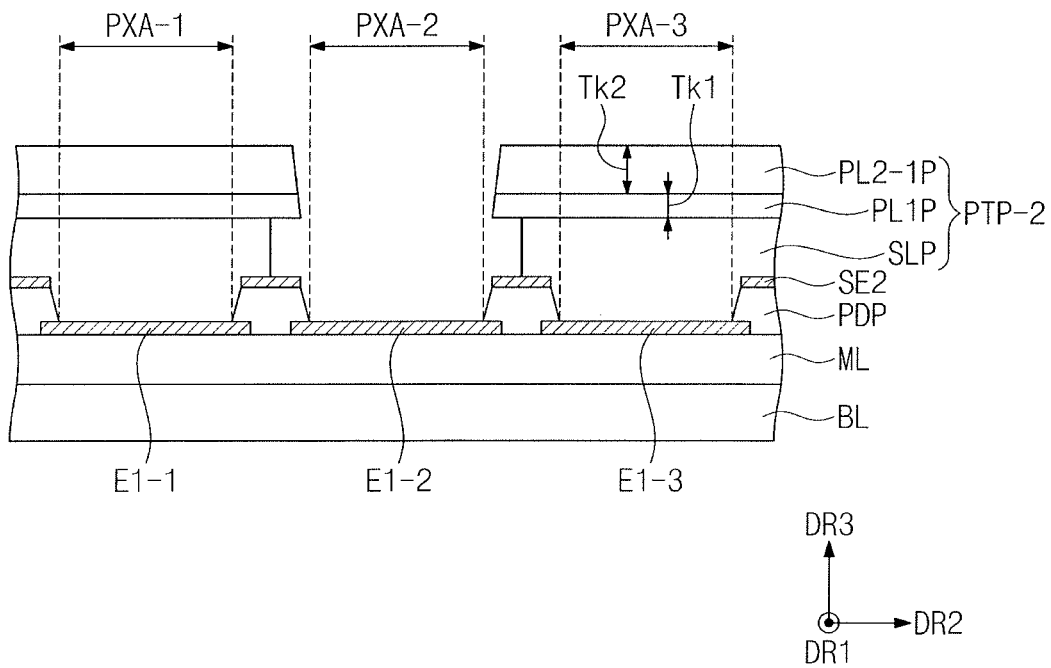

FIGS. 10A to 10B are views illustrating some of manufacturing processes of a display device according to an example embodiment. In describing FIGS. 10A and 10B, the components described through FIGS. 5A to 5G are described by the same reference numerals, and the description thereof may not be repeated for clarity.

Referring to FIG. 10A, the sacrificial layer SL is formed to cover the pixel definition film PDP and the first electrodes E1-1, E1-2, and E1-3. A first film PL1 is formed on the sacrificial layer SL. A second film PL2-1 is formed on the first film PL1.

The first film PL1 may have a first thickness TK1 and the second film PL2-1 may have a second thickness TK2. The first film PL1 may have a first cure shrinkage ratio and a second film PL2-1 may have a second cure shrinkage ratio. The second cure shrinkage ratio may be greater than the first cure shrinkage ratio. Thus, a film having a relatively greater cure shrinkage ratio may have a greater thickness.

The first film PL1 and the second film PL2-1 may include materials different from each other. For example, the first film PL1 and the second film PL2-1 may include or be formed of respective monomers having mutually different numbers of functional groups. The monomer contained in the second film PL2-1 may have a greater number of functional groups than the monomer contained in the first film PL1.

Referring to FIG. 10B, a pattern part PTP-2 is formed by patterning the sacrificial layer SL, the first film PL1, and the second film PL2-1. The pattern part PTP-2 may include a sacrificial pattern SLP, a first pattern PL1P, and a second pattern PL2P-1.

Figure 11:
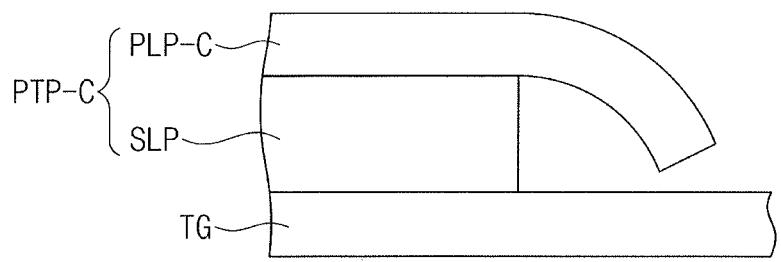
FIG. 11 illustrates a cross-sectional view of a pattern part according to a comparative example.
Figure 11:
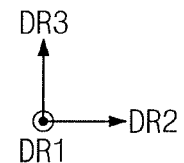

FIG. 11 is a cross-sectional view illustrating a pattern part according to a comparative example.

Referring to FIG. 11, a pattern part PTP-C may have a sacrificial pattern SLP and a comparative pattern PLP-C. The comparative pattern PLP-C may be a photoresist pattern. According to the comparative example, the comparative pattern PLP-C may be configured as a single layer.

The sacrificial pattern SLP may have an undercut shape with respect to the comparative pattern PLP-C, and the comparative pattern PLP-C may have a region that is deflected, e.g., sags, where the sacrificial pattern SLP is not disposed under the comparative pattern PLP-C.

In this case, an etchant may not smoothly be supplied to the sacrificial pattern SLP during the process of removing the sacrificial pattern SLP. In addition, where the comparative pattern PLP-C contacts a target object TG, gas generated during the process may not smoothly be discharged. This may cause a process defect.

Figure 12:
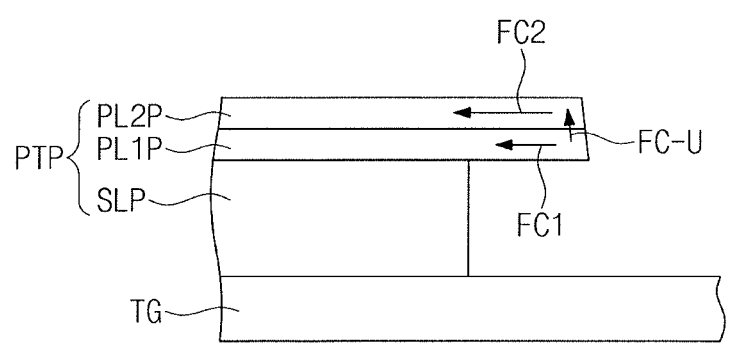
FIGS. 12 to 14 illustrate cross-sectional views of pattern parts according to example embodiments.
Figure 12:
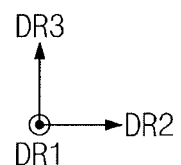
Figure 13:
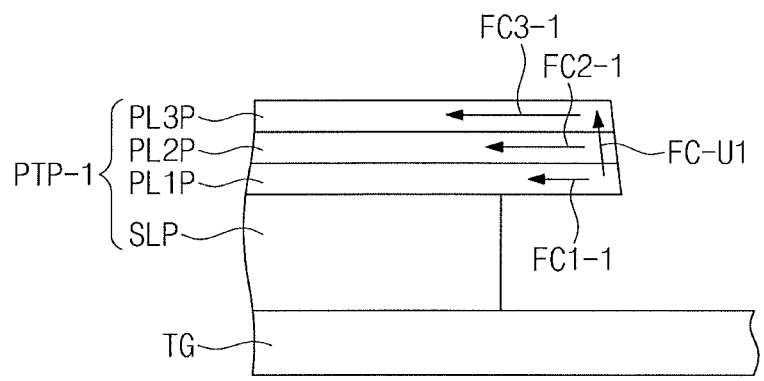
Figure 14:
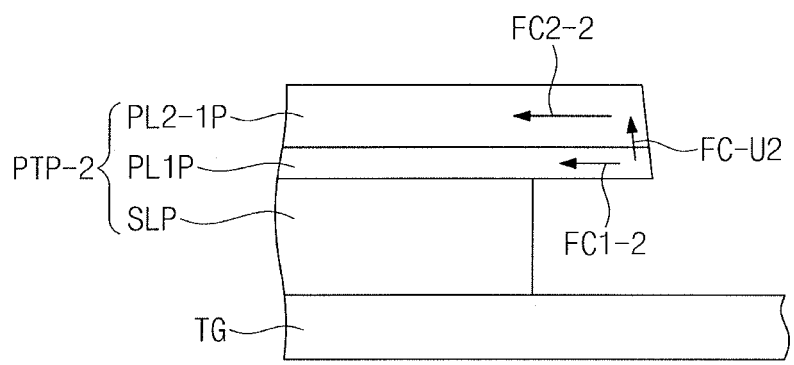

FIGS. 12 to 14 are cross-sectional views illustrating pattern parts according to example embodiments.

Referring to FIG. 12, a pattern part PTP may include a sacrificial pattern SLP, a first pattern PL1P, and a second pattern PL2P. The first pattern PL1P and the second pattern PL2P may be photoresist patterns. The cure shrinkage ratio of the second pattern PL2P may be greater than the cure shrinkage ratio of the first pattern PL1P.

In FIG. 12, force according to shrinkage is exemplarily illustrated using vectors whose orientations and lengths may be seen as indicating respective forces. A first force FC1 may be a force according the shrinkage of the first pattern PL1P, and a second force FC2 may be a force according to the shrinkage of the second pattern PL2P. The second force FC2 may be greater than the first force FC1. At a boundary at which the first pattern PL1P and the second pattern PL2 are in contact with each other, the first pattern PL may be pulled in the direction of the second force FC2. Thus, such an effect that a force FC-U is generated that lifts the first pattern PL1P by force proportional to the difference between the first force FC1 and the second force FC2 may be exhibited.

According to an example embodiment, even when the sacrificial pattern SLP has an undercut shape with respect to the first pattern PL1P, the probability that the first pattern PL and the second pattern PL2P, which are not supported by the sacrificial pattern SLP, are deflected may be reduced. Thus, the probability that a defect occurs during a process of removing the sacrificial pattern SLP may be reduced, and a phenomenon in which a gas discharge path is blocked may be prevented.

Referring to FIG. 13, a pattern part PTP-1 may include a sacrificial pattern SLP, a first pattern PL1P, a second pattern PL2P, and a third pattern PL3P. The first to third patterns PL1P, PL2P, and PL3P may be photoresist patterns. The cure shrinkage ratio of the third pattern PL3P may be greater than the cure shrinkage ratio of the first pattern PL1P and may be greater than the cure shrinkage ratio of the second pattern PL2P. Thus, a third force FC3-1 may be greater than the first force FC1-1 and the second force FC2-1. Thus, such an effect that a force FC-U1 is generated that lifts a portion of the first to third pattern PL1P, PL2P and PL3P that are not supported by the sacrificial layer SLP may be exhibited. In FIG. 13, three patterns of first to third patterns PL1P, PL2P, and PL3P are exemplarily illustrated. For example, the pattern part may also include four or more patterns.

Referring to FIG. 14, a pattern part PTP-2 may include a sacrificial pattern SLP, a first pattern PL1P, and a second pattern PL2-1P. The first pattern PL and the second pattern PL2-1P may be photoresist patterns. The cure shrinkage ratio of the second pattern PL2-1P may be greater than the cure shrinkage ratio of the first pattern PL1P. Accordingly, a second force FC2-2 may be greater than a first force FC1-2.

In addition, the thickness of the second pattern PL2-1P, having a greater cure shrinkage ratio, may be larger than the thickness of the first pattern PL1. Thus, a force FC-U2 that lifts a portion of the first and second patterns PL and PL2-1P, which are not supported by the sacrificial layer SLP, may be greater than the force FC-U1 of FIG. 12.

By way of summation and review, when a shape of a photoresist pattern is changed, accuracy of the shape of the pattern may be degraded. In addition, due to the deformation of the shape of the photoresist pattern, a defect may occur during a lift-off process.

As described above, embodiments relate to a pattern part, a method of forming the pattern part, and a method of manufacturing a display device using the same, wherein process reliability may be improved.

According to an example embodiment, a pattern part may include a sacrificial pattern, a first pattern, and a second pattern. The cure shrinkage ratio of the second pattern disposed on the first pattern may be greater than the cure shrinkage ratio of the first pattern. Portions of the first pattern and the second pattern that are not supported by the sacrificial pattern may have a probability of being deflected downward by a force of the contracting force of the second pattern. Thus, probability of causing defects during a process of removing the sacrificial pattern may be reduced, and the phenomenon may be prevented in which a gas discharge path is blocked by the first and second patterns.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a pattern part, the method comprising:
    forming a first film on a target object, the first film having a first cure shrinkage ratio;
    forming a second film on the first film, the second film having a second cure shrinkage ratio greater than the first cure shrinkage ratio; and
    patterning the first film and the second film to form a pattern.

2. The method as claimed in claim 1, wherein the pattern includes:
    a first pattern formed by patterning the first film; and
    a second pattern formed by patterning the second film.

3. The method as claimed in claim 2, further comprising a first curing step for curing the first film and the second film after forming the second film.

4. The method as claimed in claim 3, further comprising a second curing step for curing the pattern after forming the pattern.

5. The method as claimed in claim 4, wherein the second curing step includes:
    a first temperature curing step for curing the pattern at a first temperature; and
    a second temperature curing step for curing the pattern at a second temperature lower than the first temperature.

6. The method as claimed in claim 4, wherein, in the second curing step, a degree of shrinkage of the second pattern is greater than a degree of shrinkage of the first pattern.

7. The method as claimed in claim 1, wherein:
    in the forming of the first film, the first film is formed in a first thickness, and
    in the forming of the second film, the second film is formed in a second thickness larger than the first thickness.

8. The method as claimed in claim 1, wherein the first film includes a first monomer, the second film includes a second monomer, and a number of functional groups of the second monomer is more than a number of functional groups of the first monomer.

9. The method as claimed in claim 1, further comprising forming a third film on the second film, wherein the third film is patterned in the forming of the pattern.

10. The method as claimed in claim 9, wherein the third film has a third cure shrinkage ratio greater than the second cure shrinkage ratio.

11. The method as claimed in claim 9, wherein the first film includes a first monomer, the second film includes a second monomer, the third film includes a third monomer, a number of functional groups of the second monomer is more than a number of functional groups of the first monomer, and a number of functional groups of the third monomer is more than a number of functional groups of the second monomer.

12. The method as claimed in claim 1, further comprising forming a sacrificial layer on the target object, wherein the first film is formed on the sacrificial layer such that the first film is interposed between the second film and the sacrificial layer.

13. The method as claimed in claim 12, further comprising patterning the sacrificial layer to form a sacrificial pattern after the forming of the pattern, wherein the sacrificial pattern is formed to have an undercut shape with respect to the pattern such that the patterned first and second films extend laterally beyond an upper surface of the sacrificial pattern.

14. A method of manufacturing a display device, the method comprising:
    forming a circuit layer on a base layer;
    forming a pixel definition film that defines a pixel region on the circuit layer;
    forming a sacrificial layer that covers the pixel definition film;
    forming a first film on the sacrificial layer;
    forming a second film including a material different from that of the first film;
    patterning the first film, the second film, and the sacrificial layer to form a first pattern, a second pattern and a sacrificial pattern;
    forming a light-emitting layer on the pixel region; and
    removing the first pattern, the second pattern, and the sacrificial pattern.

15. The method as claimed in claim 14, wherein the first film has a first cure shrinkage ratio, and the second film has a second cure shrinkage ratio greater than the first cure shrinkage ratio.

16. The method as claimed in claim 14, wherein the first film includes a first monomer, the second film includes a second monomer, and a number of functional groups of the second monomer is more than a number of functional groups of the first monomer.

17. The method as claimed in claim 14, wherein in the forming of the first film, the first film is formed in a first thickness, and in the forming the second film, the second film is formed in a second thickness larger than the first thickness.

18. The method as claimed in claim 14, wherein:
    the pixel region is one of a plurality of pixel regions,
    the plurality of pixel regions include first pixel regions, second pixel regions, and third pixel regions, and
    in the forming of the first pattern, the second pattern, and the sacrificial pattern, the first pattern, the second pattern, and the sacrificial pattern are formed to cover all of the first pixel regions and the second pixel regions and to expose the third pixel regions.

19. The method as claimed in claim 14, further comprising curing the first pattern, the second pattern, and the sacrificial pattern, wherein the curing includes:
    a first temperature curing step for providing a first temperature; and
    a second temperature curing step for providing a second temperature lower than the first temperature.

20. The method as claimed in claim 14, wherein the sacrificial pattern has an undercut shape with respect to the first pattern.

21. A pattern part, comprising:
    a sacrificial pattern disposed on a target object;
    a first pattern disposed on the sacrificial pattern and having a first cure shrinkage ratio; and
    a second pattern disposed on the first pattern and having a second cure shrinkage ratio,
    wherein the second cure shrinkage ratio is greater than the first cure shrinkage ratio, and
    wherein each of the first and second patterns protrudes more than a side surface of the sacrificial pattern, and the side surface of the sacrificial pattern is exposed.

22. The pattern part as claimed in claim 21, wherein a thickness of the second pattern is larger than a thickness of the first pattern.

23. The pattern part as claimed in claim 21, wherein the sacrificial pattern has an undercut shape with respect to the first pattern.

* * * * *